United States Patent
Brekelmans et al.

(10) Patent No.: US 8,922,288 B2
(45) Date of Patent: Dec. 30, 2014

(54) OSCILLATOR CIRCUIT

(71) Applicant: NXP B.V., Eindhoven (NL)

(72) Inventors: Johannes Hubertus Antonius Brekelmans, Nederweert (NL); Reinier Hoogendoorn, Veldhoven (NL); Nenad Pavlovic, Eindhoven (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/774,163

(22) Filed: Feb. 22, 2013

(65) Prior Publication Data
US 2014/0070897 A1    Mar. 13, 2014

(30) Foreign Application Priority Data

Mar. 2, 2012  (EP) .................................... 12001450

(51) Int. Cl.
| | |
|---|---|
| H03B 5/32 | (2006.01) |
| H03L 5/00 | (2006.01) |
| H03B 5/36 | (2006.01) |
| H03B 5/06 | (2006.01) |
| H03L 3/00 | (2006.01) |
| H03B 5/12 | (2006.01) |

(52) U.S. Cl.
CPC .. *H03L 5/00* (2013.01); *H03B 5/36* (2013.01); *H03B 5/06* (2013.01); *H03L 3/00* (2013.01); *H03B 5/1212* (2013.01); *H03B 5/124* (2013.01); *H03B 5/12* (2013.01)
USPC ...... 331/158; 331/177 V; 331/167; 331/36 C; 331/116 FE; 331/116 R

(58) Field of Classification Search
CPC .................................... H03B 5/06; H03B 5/12
USPC ................ 331/158, 116 R, 116 FE, 167, 185, 331/177 V, 36 C
See application file for complete search history.

(56) References Cited

U.S. PATENT DOCUMENTS

| | | | |
|---|---|---|---|
| 5,909,152 A * | 6/1999 | Li et al. .................... | 331/116 FE |
| 6,133,801 A * | 10/2000 | Tanaka ........................... | 331/158 |
| 6,278,338 B1 | 8/2001 | Jansson | |
| 7,768,359 B2 | 8/2010 | Chang et al. | |
| 7,859,355 B2 * | 12/2010 | Brennan et al. ............... | 331/183 |
| 2005/0151596 A1 | 7/2005 | Lin | |

FOREIGN PATENT DOCUMENTS

JP       60-064506 A       4/1985

OTHER PUBLICATIONS

Williamson, T., "Oscillators for Microcontrollers", Intel Application Note AP-155, 40 pgs. (1983).
Ruffieux, D. "A High-Stability, Ultra-Low-Power Differential Oscillator Circuit for Demanding Radio Applications", Proc. of the 28th European Solid-State Circuits Conf. (ESSCIRC), pp. 85-88 (2002).
Extended European Search Report for European Patent Appln. No. 12001450.1 (Jul. 26, 2012).

* cited by examiner

*Primary Examiner* — Arnold Kinkead

(57) ABSTRACT

An oscillator circuit comprising first and second resonator terminals for connecting to respective terminals of a resonator. The oscillator circuit also comprises a first inverting amplifier connected between the first and second resonator terminals in a first mode of operation; and a back to back pair of second inverting amplifiers connected between the first and second resonator terminals in a second mode of operation. There is also provided a controller configured to compare an operational parameter of the oscillator circuit to a switchover threshold, and switch the oscillator circuit from the first mode of operation to the second mode of operation when the operational parameter exceeds the switchover threshold.

8 Claims, 11 Drawing Sheets

OSCILLATOR CIRCUIT

CROSS-REFERENCE TO RELATED APPLICATIONS

Figure 1:
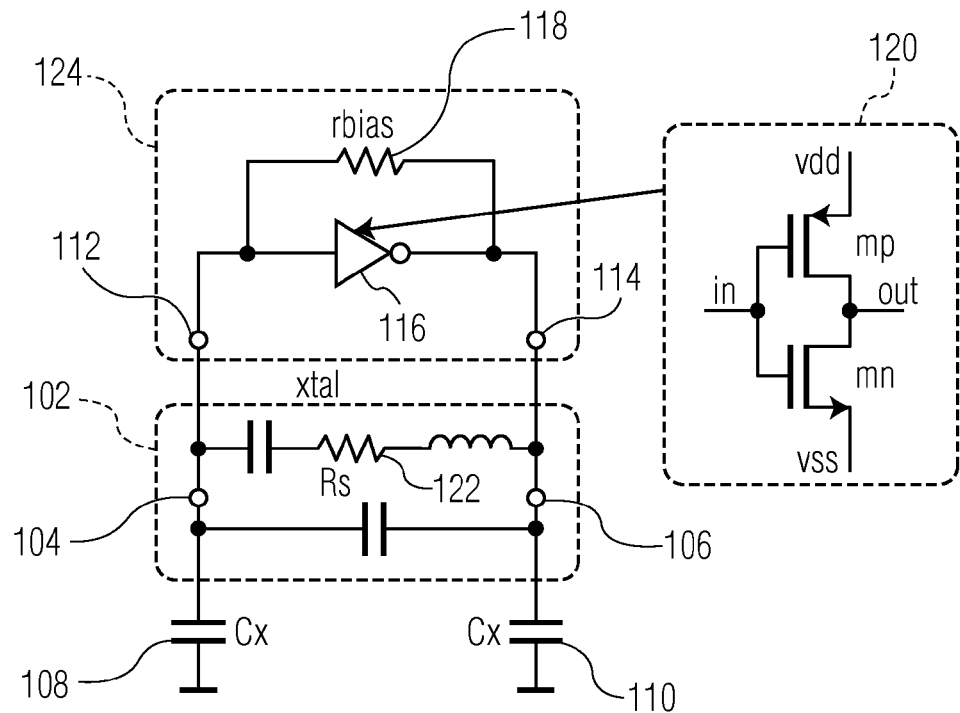

This application claims the priority under 35 U.S.C. §119 of European patent application no. 12001450.1, filed on Mar. 2, 2012, the contents of which are incorporated by reference herein.

FIELD

The present disclosure relates to the field of oscillator circuits, and in particular, although not exclusively, to oscillator circuits for crystal resonators or mechanical resonators.

BACKGROUND

Crystal resonators/oscillators can be used to provide an accurate and stable frequency reference. However, when applied in transceivers, phase noise and jitter of a crystal oscillator can degrade performance of the transceiver. Thus, it is desirable to provide crystal oscillators having low noise and high stability.

BRIEF SUMMARY

According to a first aspect of the invention, there is provided a oscillator circuit comprising:
  first and second resonator terminals for connecting to respective terminals of a resonator;
  a first, in some examples single, inverting amplifier connected between the first and second resonator terminals in a first mode of operation;
  a back to back pair of second inverting amplifiers connected between the first and second resonator terminals in a second mode of operation; and
  a controller configured to compare an operational parameter of the oscillator circuit to a switchover threshold, and switch the oscillator circuit from the first mode of operation to the second mode of operation when the operational parameter exceeds the switchover threshold.

Such an oscillator circuit can be used to oscillate at a desired frequency without slipping into a relaxation mode causing an oscillation at an unwanted frequency. Using the two different modes of operation can enable the desired oscillation signal to be established in the first mode of operation before switching to the second mode of operation, during which the oscillation signal has better balance than in the first mode of operation. Also, using these two modes of operation allows using a simple amplifier structure for the core of the oscillator and can avoid a requirement for complicated and expensive components that would occupy space in and outside an integrated circuit.

The operational parameter may be the amplitude at the resonator terminals, at the output of the oscillator circuit, or at any other point in the oscillator circuit. The operational parameter may be any other property that is representative of the oscillation becoming established.

The controller may comprise a detector, such as an amplitude differential detector, configured to measure the operational parameter of the oscillator circuit. The controller may further comprise a comparator configured to compare the measured operational parameter of the oscillator circuit with one or more target thresholds pertaining to the first and/or second mode of operation. The comparator may comprise an analogue to digital converter.

The one or more target thresholds may comprise an upper target threshold and a lower target threshold. The controller may be configured to set one or more circuit parameters to cause or maintain the operational parameter to be between the upper and lower target thresholds. In this way, operation of the oscillator circuit in the second mode of operation can be tailored to specific application requirements.

The oscillator circuit may be configured to set one or more of the circuit parameters to one or more preset values when switching the oscillator circuit from the first mode of operation to the second mode of operation. Use of such preset values can reduce transient effects and speed-up the settling of the oscillator amplitude to a value needed for optimal performance after entering the second mode of operation.

The one or more preset values may correspond to values established and saved in memory, for example non-volatile memory, during a previous operation of the oscillator circuit. In this way, environmental and time-varying conditions can be taken into account to improve the settling performance of the oscillator circuit when changing to the second mode of operation.

In other examples, the preset values could be predetermined, and optionally hard-coded in memory.

The one or more circuit parameters may comprise the gain of the inverting amplifiers and/or a supply voltage to the second inverting amplifiers. The oscillator circuit may further comprise a variable coupling capacitor in series with each of the second inverting amplifiers between the first and second resonator terminals. The one or more circuit parameters may comprise the capacitance of the coupling capacitors. Use of the one of more circuit parameters can enable operation of the oscillator circuit to be adjusted finely or coarsely, for example as a function of the difference between the value of the operational parameter and the one or more target thresholds.

One of the back to back pair of inverting second amplifiers may act as the first inverting amplifier. The controller may be configured to disconnect one of the back to back pair of inverting second amplifiers from between the first and second resonator terminals when the oscillator circuit is in the first mode of operation. Such an embodiment can make efficient use of components and limited space on an integrated circuit.

The controller may be configured to include a coupling capacitor in series with the first inverting amplifier in the second mode of operation. The controller may be configured to exclude the coupling capacitor in the first mode of operation. The coupling capacitor may be implemented as part of the back to back pair of second inverting amplifiers. In some examples, such a coupling capacitor can be advantageous for the second mode of operation, but disadvantageous for the first mode of operation.

The resonator may be a crystal resonator.

The oscillator circuit may further comprise the resonator connected to the first and second resonator terminals.

There may be provided an integrated circuit comprising any oscillator circuit disclosed herein.

According to a further aspect of the invention, there is provided a method of operating an oscillator circuit, the oscillator circuit comprising:
  first and second resonator terminals for connecting to respective terminals of a resonator;
  a first/single inverting amplifier connected between the first and second resonator terminals in a first mode of operation; and
  a back to back pair of second inverting amplifiers connected between the first and second resonator terminals in a second mode of operation;

the method comprising:
  comparing an operational parameter of the oscillator circuit to a switchover threshold; and
  switching the oscillator circuit from the first mode of operation to the second mode of operation when the operational parameter exceeds the switchover threshold.

The method may further comprise the setting of one or more circuit parameters to one or more preset values when switching the oscillator circuit from the first mode of operation to the second mode of operation, wherein the one or more preset values correspond to values established during a previous operation of the oscillator circuit.

There may be provided a computer program, which when run on a computer, causes the computer to configure any apparatus, including a circuit, controller, converter, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

The computer program may be provided on a computer readable medium, which may be a physical computer readable medium such as a disc or a memory device, or may be embodied as a transient signal. Such a transient signal may be a network download, including an internet download.

DRAWING DESCRIPTION

Figure 2:
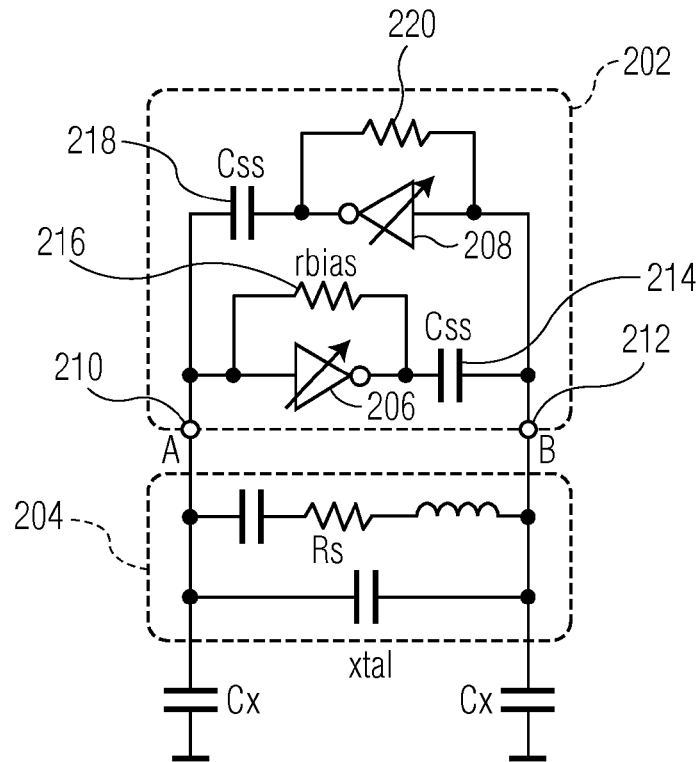
Figure 3:
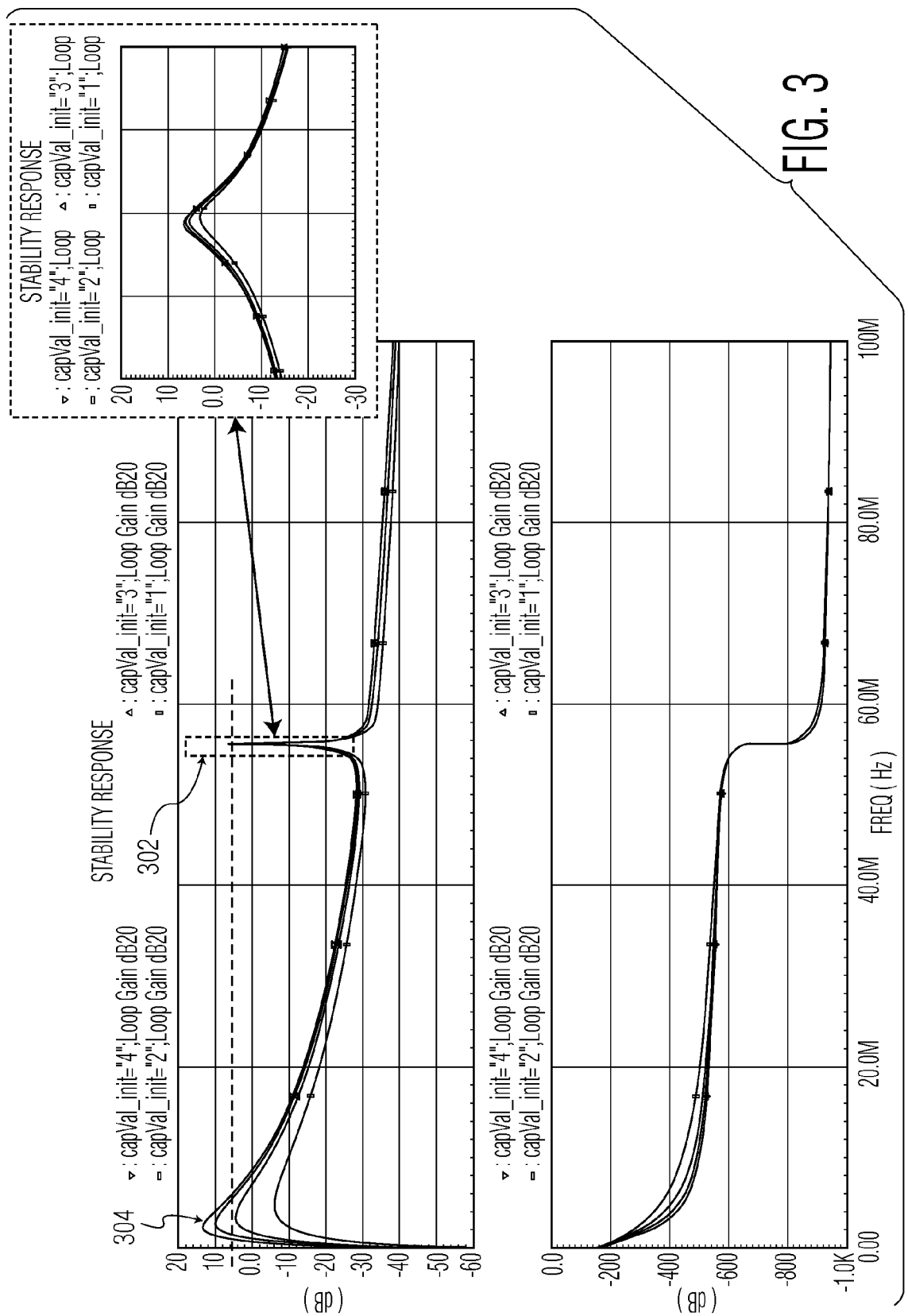
Figure 4:
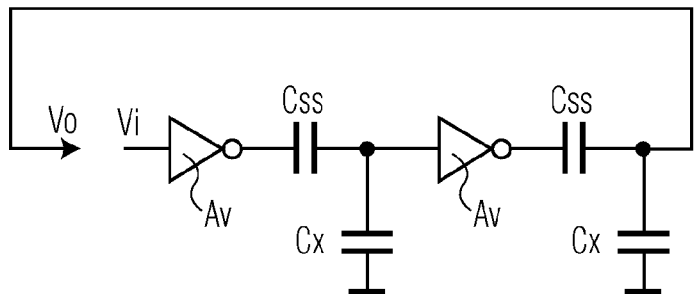
Figure 5:
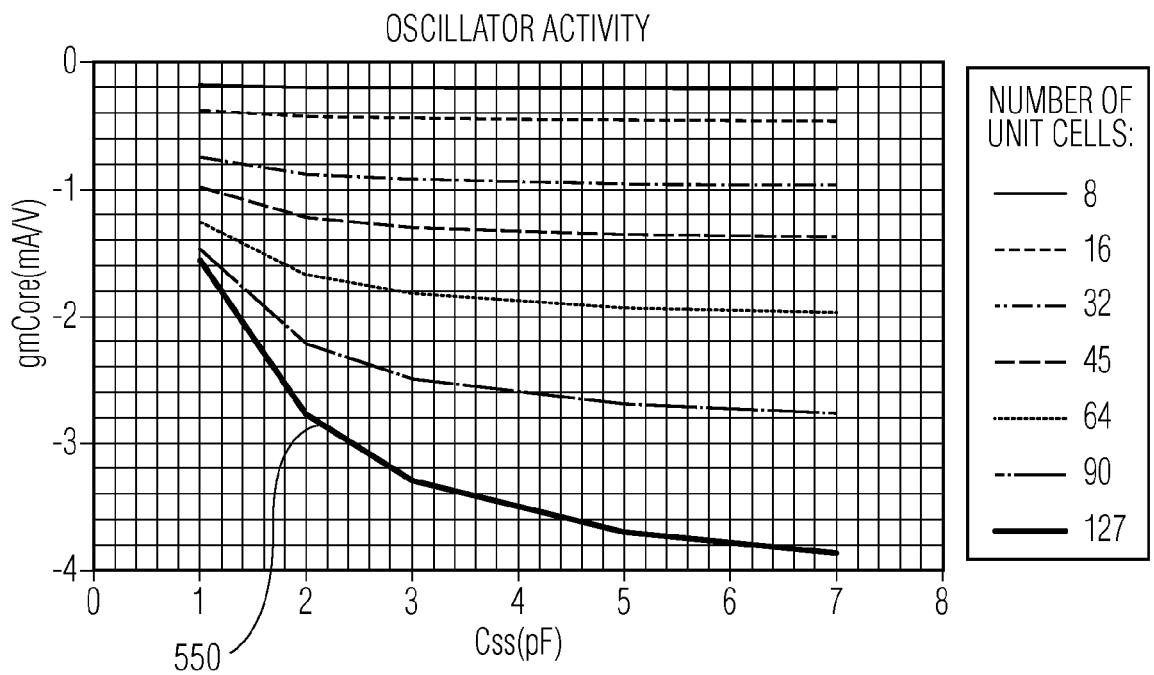
Figure 6A:
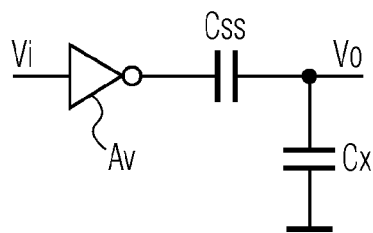
Figure 6B:
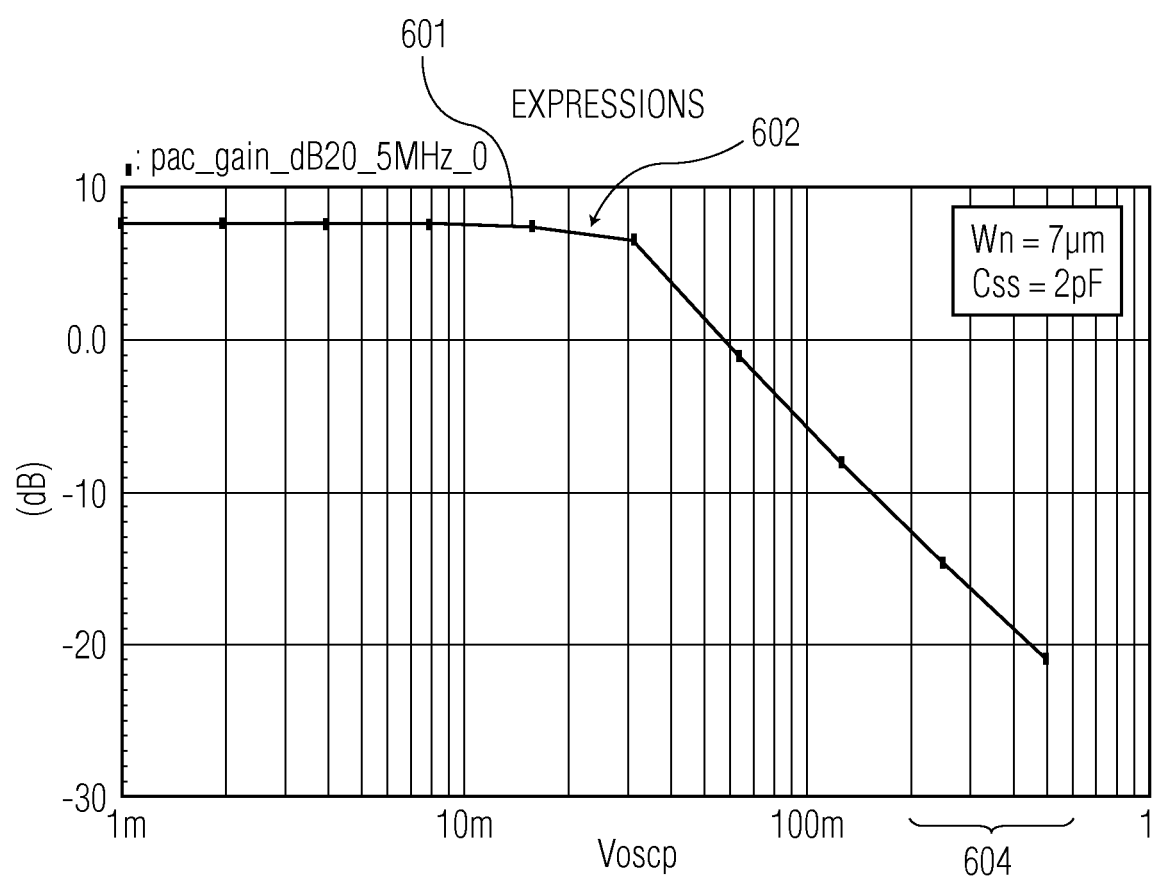
Figure 7A:
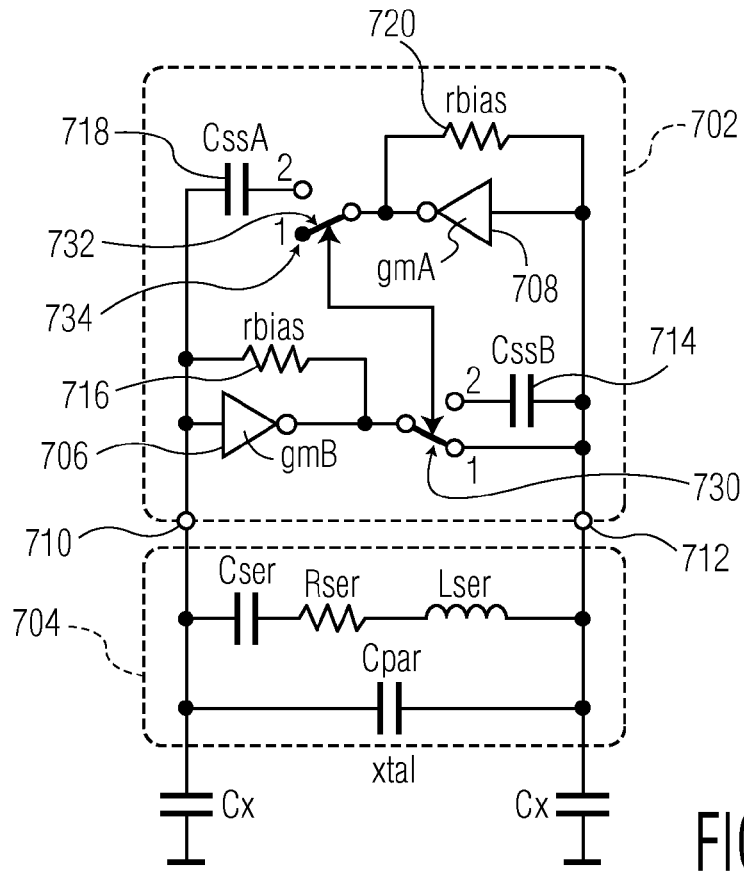
Figure 7B:
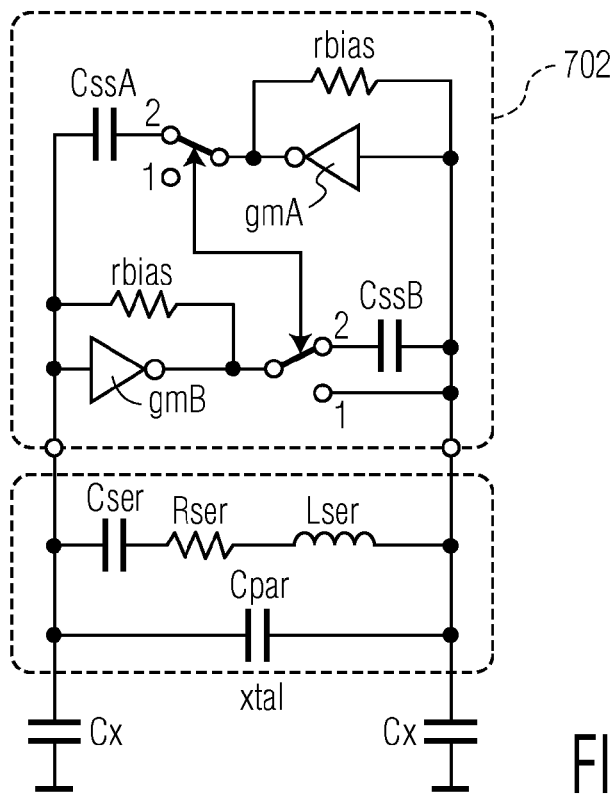
Figure 8A:
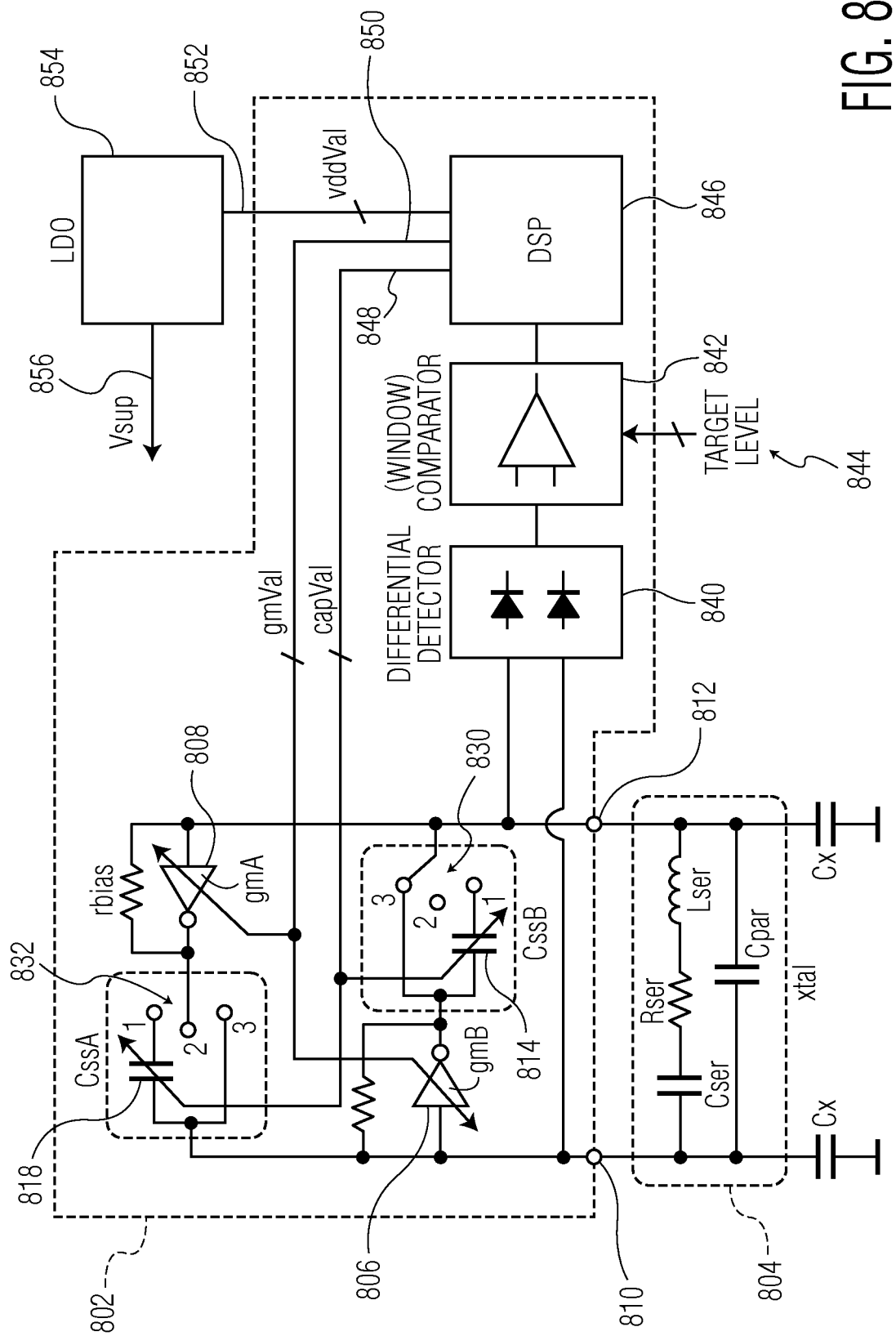
Figure 8B:
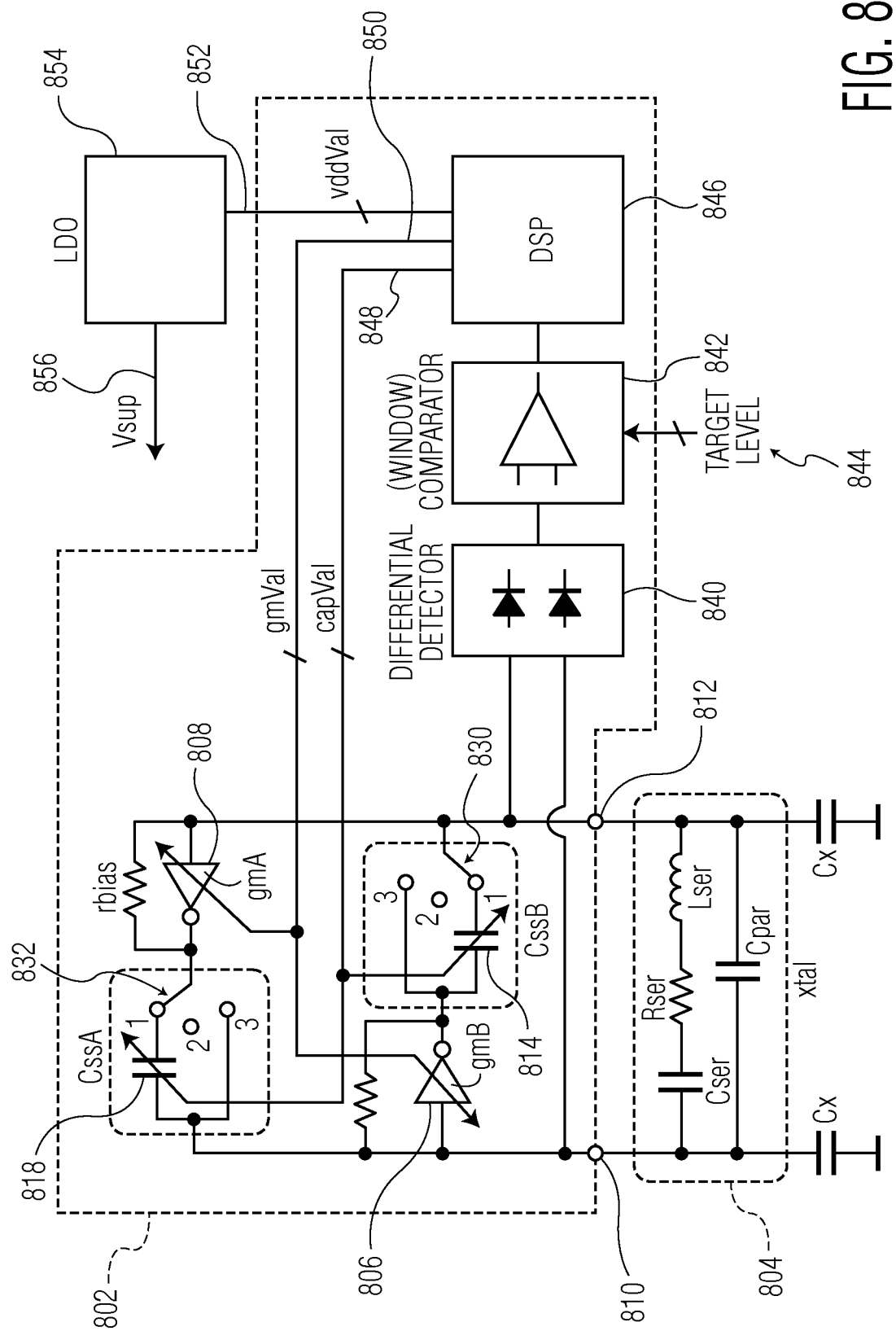
Figure 9:
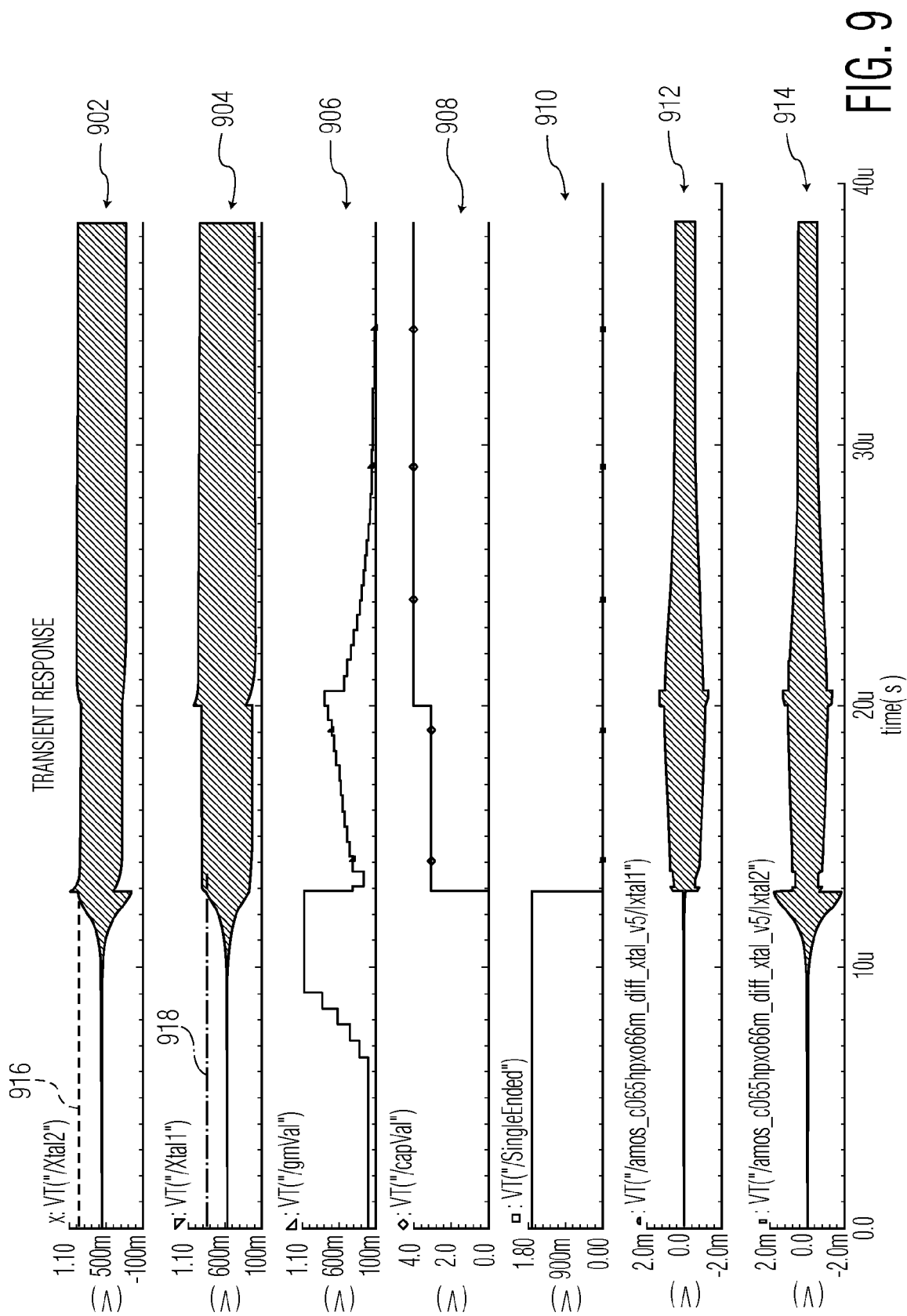
Figure 10:
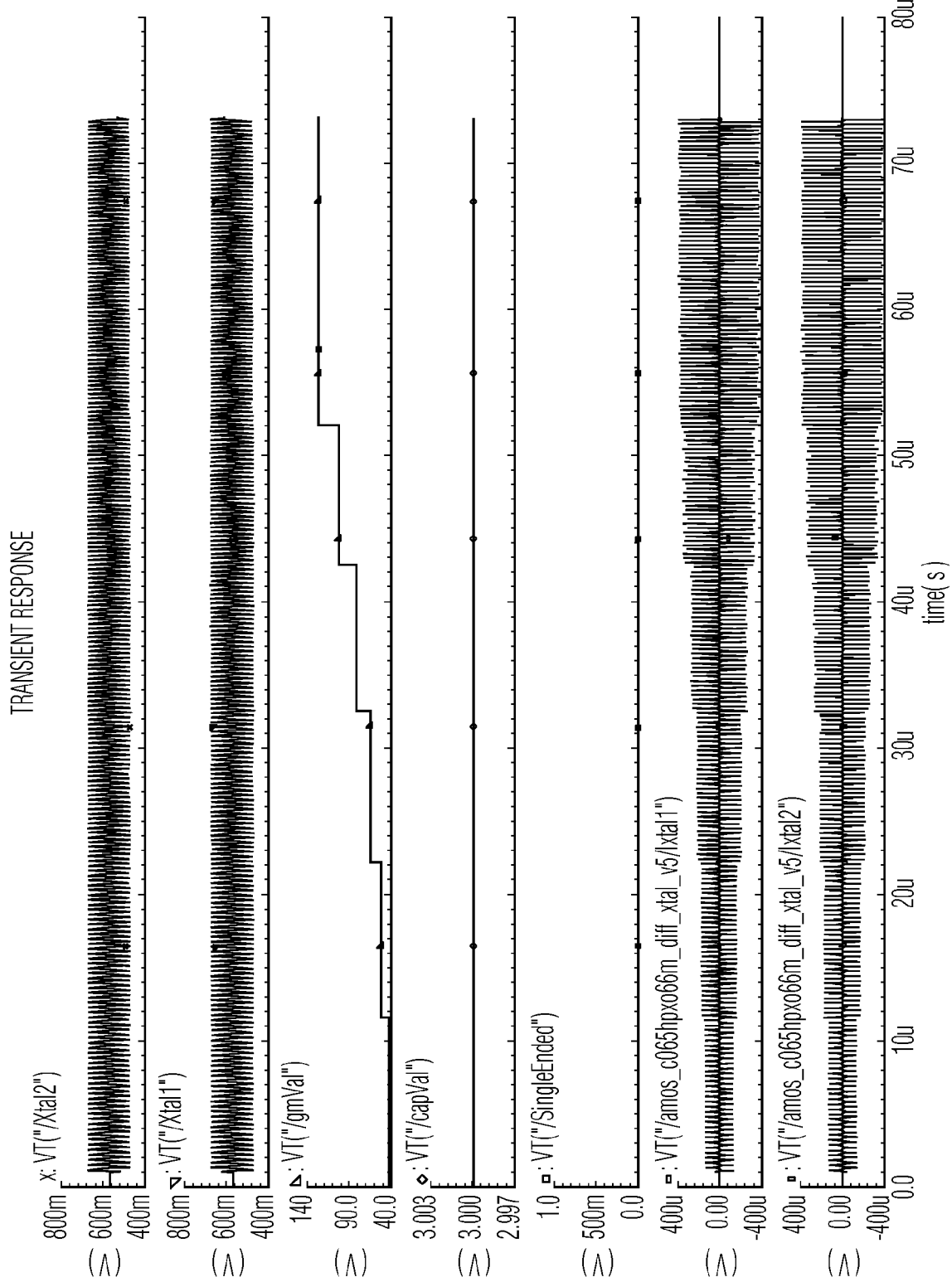
Figure 11:
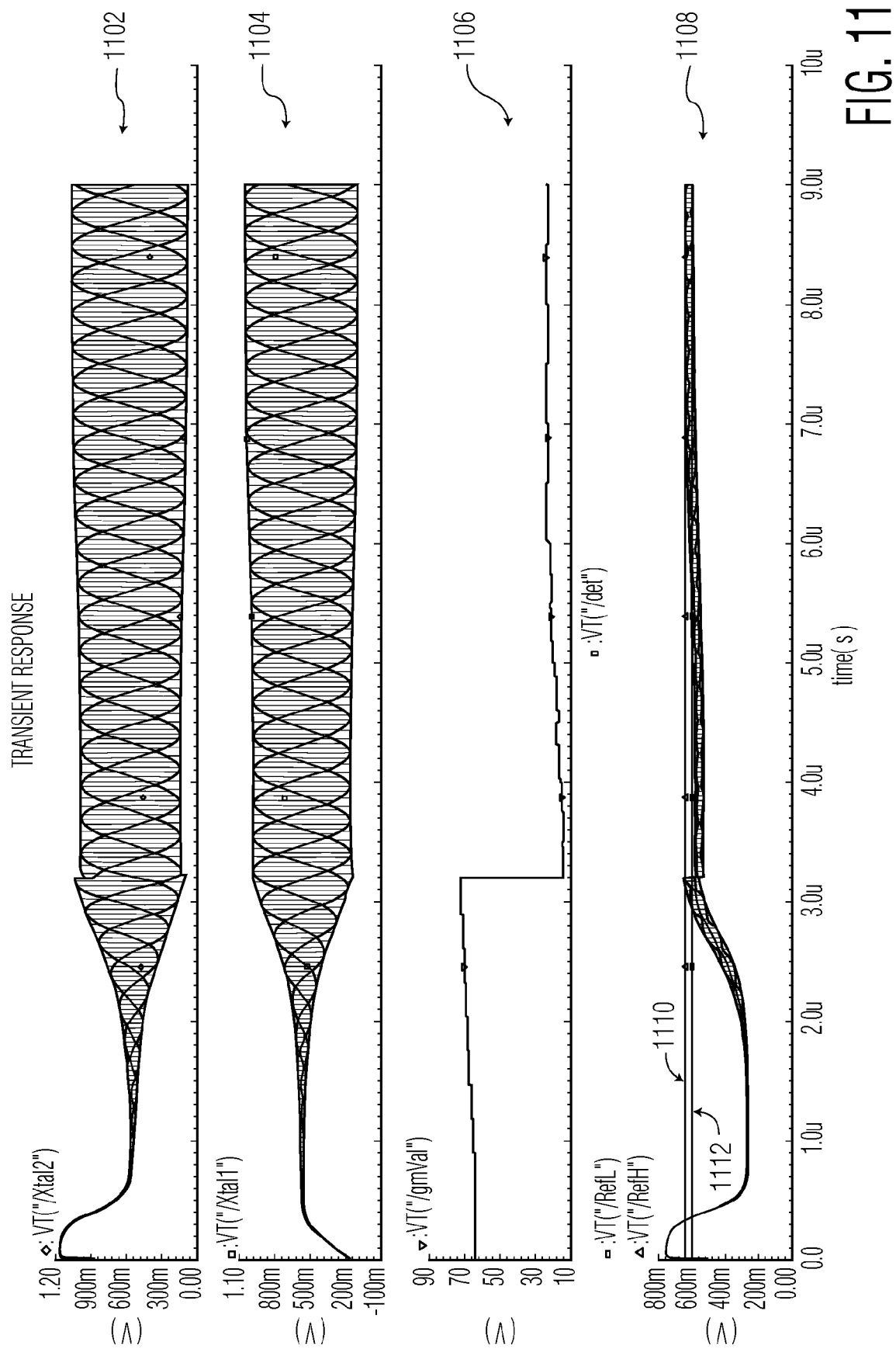
Figure 12A:
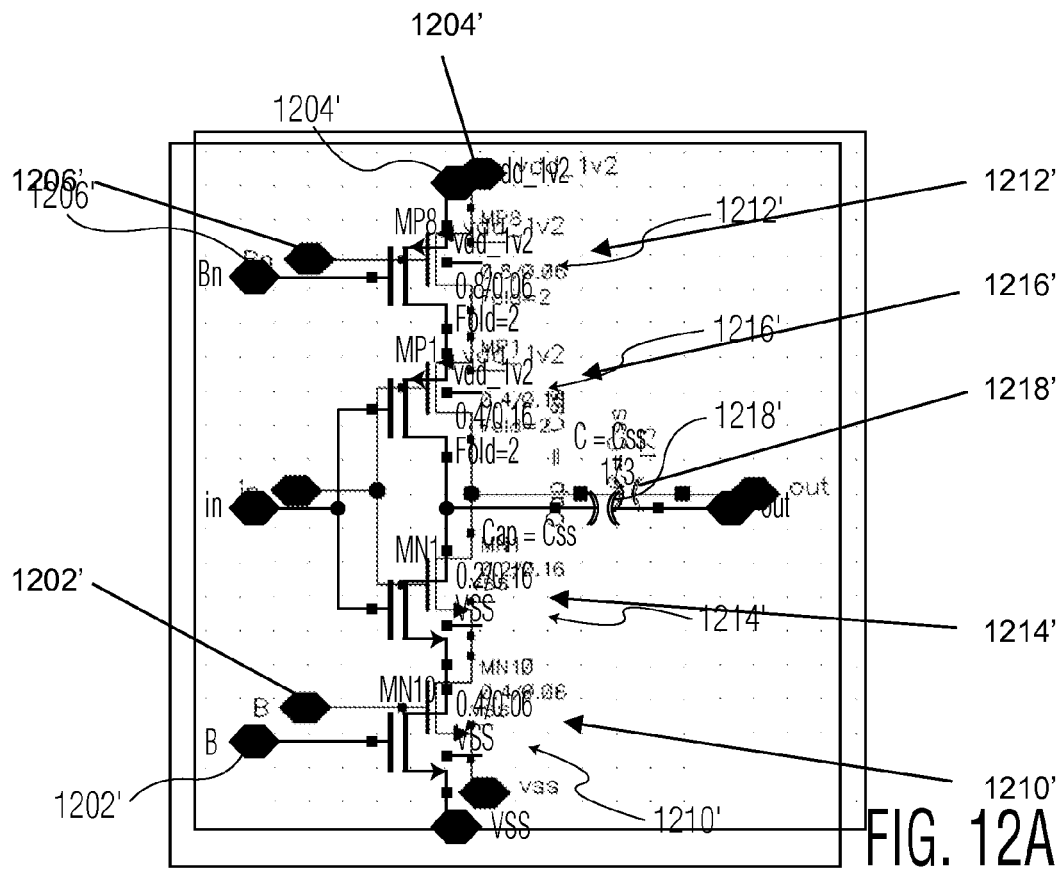
Figure 12B:
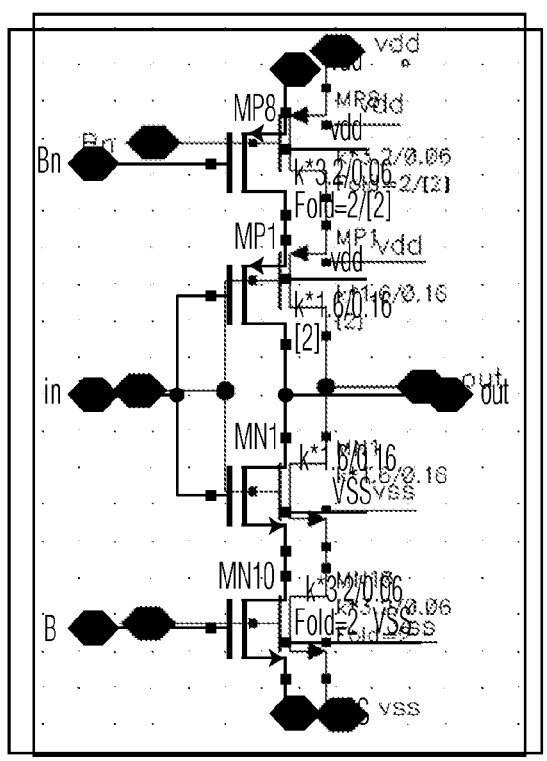

A description is now given, by way of example only, with reference to the accompanying drawings, in which:
  FIG. 1 illustrates a configuration of an inverter-based single-ended oscillator circuit;
  FIG. 2 illustrates a configuration of an inverter-based differential oscillator circuit;
  FIG. 3 illustrates a simulated bode plot of the transfer function of the oscillator circuit of FIG. 2 at start-up;
  FIG. 4 shows a simplified representation of a loop of FIG. 2 at low frequencies;
  FIG. 5 shows the simulated real part of admittance Y of the oscillator circuit of FIG. 2, as available between resonator terminals A and B with resonator circuitry removed;
  FIG. 6a shows a simplified representation of one half of the differential oscillator circuit shown in FIG. 2;
  FIG. 6b shows simulation results for the circuit of FIG. 6a;
  FIG. 7a illustrates an oscillator circuit according to an embodiment of the invention configured for a single-ended mode of operation;
  FIG. 7b illustrates the oscillator circuit of FIG. 7a configured for a differential mode of operation;
  FIG. 8a illustrates an oscillator circuit according to another embodiment of the invention configured for a single-ended mode of operation;
  FIG. 8b illustrates the oscillator circuit of FIG. 8a configured for a differential mode of operation;
  FIG. 9 shows a transient simulation of the circuit of FIGS. 8a and 8b in order to illustrate a start-up sequence of the circuit;
  FIG. 10 illustrates operation of the oscillator configured for differential operation as shown in FIG. 8b when started in differential mode;
  FIG. 11 illustrates further simulation results of the oscillator start-up; and
  FIGS. 12a and 12b illustrate example implementations of two types of CMOS circuits that can be used as the inverting amplifiers in an oscillator circuit according to an embodiment of the invention.

DETAILED DESCRIPTION

One or more embodiments disclosed herein relate to an oscillator circuit for connecting to a resonator such as a crystal resonator. The oscillator circuit has a first and a second mode of operation, and can switch from the first mode of operation to the second mode of operation when an operational parameter exceeds a switchover threshold. The operational parameter can be the amplitude of an output oscillation signal. The first mode of operation can involve use of a single ended amplifier circuit and can be used to establish oscillation at a desired frequency. The second mode of operation can involve use of a differential amplifier circuit and can provide a more balanced output oscillation signal than is possible with the first mode of operation.

Even though the amplitude of oscillation usually is not a system specification, for a number of reasons it can still be important to have well defined crystal oscillator amplitude. For example, the power dissipated in a crystal depends on the amplitude of oscillation and, to ensure stable crystal frequency with aging, the dissipated power should not exceed several milliwatts. Another reason is that phase noise tends to improve with higher oscillation power while harmonic content of the oscillator signal degrades at higher power when non-linearity of active devices comes into effect. Higher harmonics of the crystal oscillator signal present at crystal resonator pins may interfere with sensitive RF signals to be received. It can therefore be desirable to have control over the amplitude of oscillation.

FIG. 1 shows a configuration of an inverter-based so called "positive reactance oscillator". In CMOS technology, a digital inverter can be used to obtain good undistorted oscillation swing for a given supply voltage headroom.

FIG. 1 shows the equivalent circuit of a crystal resonator 102, which has a first terminal 104 and a second terminal 106. Both the first terminal 104 and second terminal 106 of the crystal resonator 102 are connected to ground by respective load capacitors Cx 108, 110. The description that follows relates to use of a crystal resonator. However, it will be appreciated that other types of resonators with a high Q factor are usable as well, for example ceramic or mechanical resonators.

The first terminal 104 of the crystal resonator 102 is coupled to an input terminal 112 of an inverting amplifier 116. The inverting amplifier may also be referred to as an inverter 116. The second terminal 106 of the crystal resonator 102 is coupled to an output terminal 114 of the inverter 116. A high-ohmic resistor "rbias" 118 is connected between the input terminal 112 and output terminal 114 of the inverter 116. The high-ohmic resistor "rbias" 118 is used to provide a DC bias to the inverter 116.

The inverter 116, working into the impedance of the feedback network, produces an output signal that is nominally 180 degrees out of phase with its input. The feedback network, incorporating the crystal resonator 102, produces the additional 180 degrees phase shift to obtain the required 360 degrees phase shift at the oscillation frequency. The amplitude of oscillation can be adjusted by controlling the gain of the inverter, which can be achieved by changing the number of unit transistors 120 working in parallel (as shown in the exploded view of the inverter 116 in FIG. 1).

However, in practice, the signals at the input and output terminals 112, 114 of the inverter 116 are mismatched; they are not truly differential (that is, with equal amplitude and opposite phase). A phase error of up to 20 degrees may exist depending upon the value of the loss resistance Rs 122 in the crystal resonator 102 in conjunction with the load capacitors Cx 108, 110. The oscillator swing at the inverter output 114 may be a few percent larger than at the input 112 and may contain more distortion. This phase and amplitude mismatch can make it difficult to extract a truly differential digital reference signal. This is relevant to enable the signal to be cleaned of unwanted common mode disturbing signals, for example from polluted supply or ground connections, amongst other things.

The inverter 116 and "rbias" resistor 118 can together be referred to as a single-ended oscillator circuit 124 for the crystal resonator 102. The term "single-ended" may be construed as a circuit that does not have an axis of symmetry, which is in contrast to a differential circuit as described below with reference to FIG. 2.

FIG. 2 illustrates an alternative oscillator circuit 202 that can be used with a crystal resonator 204. Components and features that are common to FIG. 1 will not necessarily be described again with reference to FIG. 2.

The oscillator circuit 124 of FIG. 1 has been extended to include a second inverter 208 in parallel with the first inverter 206. The first and second inverters 206, 208 are in reverse orientation with respect to each other and can be referred to as being "back to back". In contrast to the oscillator circuit 124 of FIG. 1, the oscillator circuit 202 of FIG. 2 is a differential circuit. It can be seen that the two back to back inverting amplifiers 206, 208 provide an axis of symmetry in the oscillator circuit 202. The oscillator circuit 202 of FIG. 2 can produce an output signal with a much better balance than the oscillator circuit 124 of FIG. 1.

The first inverter 206 is in a first circuit branch between the first terminal 210 and second terminal 212 of the oscillator circuit 202. The first terminal 210 and the second terminal 212 may be referred to as resonator terminals. This first circuit branch includes the first inverter 206 in series with a first AC coupling capacitor Css 214. Also, a first DC bias resistor rbias 216 is in parallel with the first inverter 206.

Similarly, the second inverter 208 is in a second circuit branch between the first terminal 210 and second terminal 212 of the oscillator circuit 202. This second circuit branch includes the second inverter 208 in series with a second AC coupling capacitor Css 218. Also, a second DC bias resistor 220 is in parallel with the second inverter 208.

The AC coupling capacitors Css 214, 218 are included to prevent a latch up of the oscillator core. Without the AC coupling capacitors, the positive feedback present at DC can cause the operating points of the amplifiers to run away and take on a value equal to the positive (negative) and negative (positive) supply voltage respectively. In this condition the circuit cannot provide a gain anymore and hence will not oscillate.

It can be seen from FIG. 2 that the two back-to-back coupled inverters 206, 208 introduce an extra feedback path, which bypasses the crystal resonator 204. This affects the frequency response of the oscillator circuit 202, as described below with reference to FIG. 3.

FIG. 3 illustrates a simulated bode plot of the transfer function of the oscillator circuit 202 of FIG. 2 at start-up, as a function of the capacitor value Css (1 to 4 pF). The transistors in the two inverters 206, 208 for this simulation have the following parameters: L=0.16 µm, Wn=n*0.2 µm and Wp=n*0.4 µm (8≤n≤127), supply voltage vdd=1.2 V.

The plots of FIG. 3 have frequency on the horizontal axes, and (i) magnitude on the vertical axis of the upper plot (the bode magnitude plot); and (ii) phase on the vertical axis of the lower plot (the bode phase plot). FIG. 3 shows a first response 302 at a desired frequency of 55 MHz and a second response 304 at lower, undesired, frequencies.

Depending on the value of capacitor Css (1 to 4pF, indicated as capVal in FIG. 3) the magnitude of the second, unwanted, response 304 may be higher than the magnitude of the first response 302. In such circumstances, the oscillator circuit 202 of FIG. 2 will oscillate at a frequency of tens of kHz to a few MHz instead of at the desired 55 MHz. This is because the transfer function of the feedback path that bypasses the crystal resonator also meets the Barkhauzen criteria (loop-gain=1 and loop-phase=n.360°) and has a stronger magnitude response than the desired transfer function at 55 MHz.

The magnitude of the low frequency response strongly depends on the value of the AC coupling capacitors Css 214, 218. This is illustrated by FIG. 4. FIG. 4 shows a simplified representation of the loop of FIG. 2 at low frequencies. That is, the loop that excludes the crystal resonator. To keep the magnitude of the response at the unwanted frequencies low, Css should be kept small compared to Cx. However, the required loop gain for the wanted 55 MHz response (which can be governed in particular by the loss resistor Rs in the crystal resonator together with the load capacitance Cx) may require a large Css value.

FIG. 5 shows the simulated real part of admittance Y of the oscillator circuit 202 of FIG. 2 as a function of capacitor value Css (on the horizontal axis) and the width of transistors mn and mp in the two inverters 206, 208. The width of the transistors is shown in FIG. 5 by the seven different plots. As indicated in FIG. 5, each of the different plots represents a different number of unit cells/transistors in the amplifiers. The transistors in this simulation have the following parameters: gate length L=0.16 µm, nmos gate width Wn=n*0.2 µm and pmos gate width Wp=n*0.4 µm (8≤n≤127), and supply voltage vdd=1.2V.

For a secure start-up with a typical 55 MHz crystal resonator, a negative resistance value of about −300 Ω (−3.3 mS conductance) between the input and output terminals 210, 212 of the oscillator circuit 202 is required. As will be appreciated from the bottom plot 550 of FIG. 5, the value of Css then needs to be at least 3 pF if 127 unit cells are used. It can also be seen that use of 90 unit cells or less would mean that the required conductance of −3.3 mS cannot be achieved. On the basis of the curves shown, an estimate can be made that gm=−3.3 mS could also be achieved for about 100 unit cells with Css set as about 5 pF, or perhaps 110 unit cells with Css set as about 3.5 pF, et cetera.

However, if Css is set as a value between 3 pF and 5 pF, then the magnitude of the unwanted frequency response is greater than the magnitude of the wanted frequency response (as shown in FIG. 3) and it is not possible to start-up the circuit of FIG. 2 at the desired frequency of 55 MHz. The unwanted frequency response thus may lead to an unwanted oscillation that from the mechanism of the oscillation is generally known as a relaxation mode oscillation.

Although it may be possible to deal with the unwanted relaxation mode by making provisions in the design, for example by choosing a suitable circuit topology, such a solution is generally undesired. Circuits that can be capable of preventing the unwanted oscillation mode may require increased supply voltage, circuit area and circuit complexity and can usually have less than optimal phase noise performance. In one example, an inductor could be used to remove the unwanted low frequency response, but this can be undesirable because of the cost of the extra component.

According to an embodiment of the invention, saturation properties of the digital inverters can be used to address the problem of the differential oscillation circuit switching to an operation in the unwanted relaxation mode. In one example, using transistors with a gate length L=0.16 µm, the open voltage gain Av of a thin oxide inverter in 65 nm CMOS technology is about 26x. This gain is independent of the gate width W. Therefore, for a supply voltage of 1.2V, the inverter stage will be overdriven when it receives a voltage in excess of 2 mVp (millivolts peak) (≈0.5*vdd/26) at its input and hence at either the first or second resonator terminals of the oscillator circuit (these terminals are connected to the crystal resonator). Therefore, for typical oscillation amplitudes in the range 200 mV to 600 mVp, the inverter will be strongly overdriven. This causes the effective voltage gain to decrease by an amount about equal to the over-drive factor.

FIG. 6a shows a simplified representation of one half of the differential oscillator circuit 202 shown in FIG. 2. FIG. 6b shows simulation results for the circuit of FIG. 6a. FIG. 6b shows magnitude of the voltage gain response 602 at 5 MHz as a function of the amplitude (Voscp) of a 55 MHz sinusoidal signal applied at its input. FIG. 6b shows that the oscillator circuit becomes saturated when the peak voltage at the input to the oscillator circuit (Voscp) reaches about 25 mV 606, which is consistent with the above calculations. The significant reduction in voltage gain for Voscp values in the range of 200 mV to 600 mV 604 can also be seen in FIG. 6b. In reality, the gain reduction is even more significant as the (average) output impedance of the inverter stage also decreases for an increasing swing in the values of the output voltage (Voscp).

It can be appreciated from FIG. 6b that the gain at the low, unwanted frequencies of about 5 MHz relative to the wanted frequency of 55 MHz is reduced as the amplitude of the oscillator output signal increases. In accordance with this determination, an embodiment of the invention relates to only operating the differential oscillator circuit when the amplitude is sufficiently high such that magnitude of the gain at the wanted frequencies is greater than the magnitude of the gain at the unwanted frequencies. In this way, the differential oscillator circuit will continue to operate at the wanted frequency and will not "slip" into an unwanted relaxation mode.

According to an embodiment of the invention, an oscillator circuit is started in a single-ended mode of operation. This mode of operation may be referred to as a start-up mode of operation or as a first mode of operation. In single-ended mode, the oscillator is unconditionally stable. Once started and having built up sufficient amplitude the inverters are sufficiently overdriven to suppress the unwanted relaxation mode response and the operating mode is switched to a differential mode. This differential mode of operation may be referred to as a "normal" mode of operation or a second mode of operation. The energy stored in the crystal resonator can keep the oscillator going at the correct frequency beyond any switching transient that is introduced by switching the mode of operation.

FIG. 7a illustrates an oscillator circuit 702 according to an embodiment of the invention configured for a single-ended mode of operation. FIG. 7b illustrates the same oscillator circuit 702 configured for a differential mode of operation. The oscillator circuit 702 of FIGS. 7a and 7b includes all of the features that are shown in FIG. 2. These common features will not necessarily be described again here.

The oscillator circuit 702 of FIGS. 7a and 7b includes a first switch 730 and a second switch 732. The first switch 730 can operatively connect the output of the first inverter 706 to either (i) a first plate of the first AC coupling capacitor Css 714 (position 2 in FIGS. 7a and 7b); or (ii) the second terminal 712 of the oscillator circuit 702 (position 1). The second plate of the first AC coupling capacitor Css 714 is connected to the second terminal 712 of the oscillator circuit 702.

The second switch 732 can operatively connect the output of the second inverter 708 to either (i) a first plate of the second AC coupling capacitor Css 718 (position 2); or (ii) open circuit 734 (position 1); or (ii) open circuit 734 (position 1). The second plate of the second AC coupling capacitor Css 718 is connected to the first terminal 710 of the oscillator circuit 702.

The first and second terminals 710, 712 of the oscillator circuit may be referred to as resonator terminals.

When the oscillator circuit 702 is in the single-ended mode of operation, the first switch 730 connects the output of the first inverter 706 to the second terminal 712 of the oscillator circuit 712 (position 1), and the second switch 732 connects the output of the second inverter 708 to open circuit 734 (position 1). In this way, a single-ended oscillator circuit 702 is provided that is the same as that shown in FIG. 1.

When the oscillator circuit 702 is in the differential mode of operation, the first switch 730 connects the output of the first inverter 706 to the firstplate of the first AC coupling capacitor Css 714 (position 2), and the second switch 732 connects the output of the second inverter 708 to the first plate of the second AC coupling capacitor Css 718 (position 2). In this way, a differential oscillator circuit 702 is provided that is the same as that shown in FIG. 2.

The last column (Gfx) of Table 1 below illustrates the simulated margin available in the loop-gain at the desired crystal resonator frequency of 55.6 MHz (referred to as 0 dB for reference) to the loop-gain at the relaxation mode at frequency fx. Results are shown for different crystal loss resistance values Rser (10, 25 and 50 Ω) and different oscillation amplitudes Voscp (0.2, 0.3, 0.4 and 0.5 Vp). In accordance with the previous discussion, the lowest margins are found at the lowest amplitude. That is, the value for Gfx, which represents the margin between the magnitude of the wanted frequency response and the unwanted frequency response, is closer to zero for low values of Voscp.

TABLE 1

| nominal Lser uH | 65 Cser fF | 1.2 Rser Ohm | Css pF | Vsup_core V | gmVal x | capVal x | fosc MHz | Voscp Vp | fx MHz | Gfx dB |
|---|---|---|---|---|---|---|---|---|---|---|
| 41.8 | 200 | 10 | 1 | 1.18916 | 6 | 1 | 55.5988 | 0.2080 | 2.6529 | −18.69 |
| 41.8 | 200 | 10 | 1 | 1.17316 | 7 | 1 | 55.5995 | 0.3062 | 2.4133 | −36.98 |
| 41.8 | 200 | 10 | 1 | 1.17716 | 7 | 2 | 55.5962 | 0.4077 | 1.9695 | −36.93 |
| 41.8 | 200 | 10 | 1 | 1.16916 | 9 | 3 | 55.5951 | 0.5007 | | |
| 41.8 | 200 | 25 | 1 | 1.17916 | 12 | 2 | 55.5966 | 0.2091 | 2.9165 | −4.32 |
| 41.8 | 200 | 25 | 1 | 1.17316 | 14 | 2 | 55.5994 | 0.3089 | 3.2123 | −26.12 |
| 41.8 | 200 | 25 | 1 | 1.17516 | 16 | 3 | 55.5989 | 0.3996 | 2.9946 | −32.96 |

TABLE 1-continued

| nominal Lser uH | 65 Cser fF | 1.2 Rser Ohm | Css pF | Vsup_core V | gmVal x | capVal x | fosc MHz | Voscp Vp | fx MHz | Gfx dB |
|---|---|---|---|---|---|---|---|---|---|---|
| 41.8 | 200 | 25 | 1 | 1.17316 | 25 | 4 | 55.6031 | 0.4961 | 3.2224 | −42.10 |
| 41.8 | 200 | 50 | 1 | 1.17316 | 25 | 2 | 55.6011 | 0.2131 | 4.3791 | −18.51 |
| 41.8 | 200 | 50 | 1 | 1.17116 | 30 | 3 | 55.6065 | 0.3107 | 4.4757 | −28.83 |
| 41.8 | 200 | 50 | 1 | 1.17315 | 33 | 5 | 55.6003 | 0.4014 | 4.0451 | −26.75 |

The columns in the table labelled gmVal and capVal represent the value of the control signals that are described below with reference to FIGS. 8a and 8b. The value for Cpar (the parasitic capacitance in the crystal resonator) is 1.9 pF, and the value for Cx is 15 pF.

FIG. 8a illustrates an oscillator circuit 802 according to an embodiment of the invention in a single-ended mode of operation. FIG. 8b illustrates the same oscillator circuit 802 in a differential mode of operation. The oscillator circuit 802 of FIGS. 8a and 8b includes all of the features that are shown in FIGS. 7a and 7b. These common features will not necessarily be described again here.

The embodiment of FIGS. 8a and 8b uses a differential inverter topology, with the output capacitively coupled to the crystal resonator, together with a digital amplitude control.

The single-ended mode of operation shown in FIG. 8a is used to build-up the oscillation amplitude before changing to the differential mode of operation. This first phase of oscillation requires a high amplifier gain, amongst other things, to overcome what is known as level dependence of the crystal resonator's 804 series resistance (Rser). This level dependence occurs at very low crystal resonator power levels, as the resonator resistance Rser is some Ohm's higher because not all of the piezo electrode contributes to oscillation.

The oscillator circuit 802 of FIGS. 8a and 8b includes a first switch 830 and a second switch 832. The first switch 830 can operatively connect the second terminal 812 of the oscillator circuit 802 to either (i) a first plate of the first AC coupling capacitor CssB 814 (position 1 in FIGS. 8a and 8b); or (ii) open circuit (position 2); or (iii) the output of the first inverter 806 (position 3). The second plate of the first AC coupling capacitor CssB 814 is connected to the output of the first inverter 806.

The second switch 832 can operatively connect the output of the second inverter 808 to either (i) a first plate of the second AC coupling capacitor CssA 818 (position 1); or (ii) open circuit (position 2); or (iii) the first terminal 810 of the oscillator circuit 802. The second plate of the second AC coupling capacitor CssA 818 is connected to the first terminal 810 of the oscillator circuit 802.

To start the oscillator circuit 802 in single-ended mode, the second switch is set in position 2 and the first switch is set in position 3 (or vice versa).

The oscillator circuit 802 in this embodiment includes a differential detector 840 that measures the amplitude of the oscillation between the first and second terminals 810, 812 of the oscillator circuit 802. The output signal from the differential detector 840 is a representation of the amplitude of the oscillation, which is compared with a switchover threshold by a window comparator 842. Exceeding the switchover threshold causes the first and second switches 830, 832 to change the mode of operation from single-ended to differential. In other embodiments, a DSP 846 (which is described in more detail below) can compare the amplitude of the oscillation with a switchover threshold in order to operate the first and second switches 830, 832. One or more of the differential detector 840, the comparator 842 and the DSP 846 can be considered as a controller.

Once the switchover threshold is exceeded, the oscillator mode of operation is changed to differential by setting both the first and second switches to position 1. In this way, both the first and second branches of the oscillator circuit 802 are completed. In addition, the AC coupling capacitors CssB, CssA 814, 818 are included in series with their respective inverters 806, 808. In the differential mode of operation the detector 840 and comparator 842 may continue to be used to set and maintain a desired amplitude of oscillation.

The output of the differential detector 840 is provided to a comparator 842, which in this example is a window comparator. The comparator 842 compares the output of the differential detector 840 with one or more target levels 844, which may also be referred to as target thresholds. In this example, the target levels 844 are an upper target level/threshold and a lower target level/threshold. The output of the comparator 842 is provided as an input to a digital signal processor (DSP) 846, or any other type of processor. The DSP generates control signals that can be used to regulate one or more circuit parameters of the oscillator circuit 802 in order to ensure that the amplitude of the oscillations is kept between the upper and lower target values 844. Furthermore, it may be necessary to maintain the amplitude of the output oscillation signal high enough to prevent the oscillator circuit from slipping into an unwanted relaxation mode, as discussed above.

In this example, the circuit parameters that can be regulated include one or more of the following:
- the capacitance of coupling capacitors Css 814, 818, which can be set by the control signal labelled "capVal" 848;
- the gain of the inverters 806, 808, which can be set by the control signal labelled "gmVal" 850; and
- the supply voltage (Vsup) 856 to the inverters 806, 808, which can be set by the control signal labelled "vddVal" 852.

The "vddVal" signal 852 is provided to a low-dropout regulator 854, which in turn provides the supply voltage (Vsup) 856 to the inverters 806, 808.

All or a subset of these circuit parameters can be adjusted by the DSP 846. A relatively coarse gain setting can be achieved by varying capVal 848, a fine gain setting can be achieved by varying gmVal 850, and the highest resolution gain setting can be achieved by setting vddVal 852. In some examples, the DSP 846 can be programmed to vary one or more of the circuit parameters in accordance with the amount of adjustment to the oscillation amplitude that is required.

In some embodiments, the comparator 842 may be implemented as an analogue to digital converter (ADC) that measures the output of the detector 840.

FIG. 9 shows a transient simulation of the circuit of FIGS. 8a and 8b in order to illustrate a start-up sequence of the circuit. Component values are as shown above in Table 1, with Rser=50 Ω and Voscp=0.35 Vp.

FIG. 9 shows the following information:
Reference 902—the amplitude of the voltage signal at the second terminal 812 of the oscillator circuit 802 (Xtal2);
Reference 904—the amplitude of the voltage signal at the first terminal 810 of the oscillator circuit 802 (Xtal1);
Reference 906—the value for the control signal gmVal 850;
Reference 908—the value for the control signal capVal 848;
Reference 910—a binary signal representative of whether or not the oscillator circuit 802 is in single ended mode (SingleEnded), this signal may be internal to any one of the differential detector 840, comparator 844 or DSP 846, depending upon which of these components is used to control the first and second switches 830, 832;
Reference 912—the magnitude of the current that is delivered by the inverters 806, 808 into the crystal resonator 804 at the first terminal 810; and
Reference 914—the magnitude of the current that is delivered by the inverters 806, 808 into the crystal resonator 804 at the second terminal 810.

It can be seen from FIG. 9 that the control signals gmVal 906 and capVal 908 start at low values. Between about 6 μsec and 10 μsec, the inverter gain gmVal 906 increases stepwise to a maximum value (which is 127 in this example) to start the oscillator. It can be seen from the signals at the first and second terminals 902, 904 that the amplitude of oscillation starts to increase after gmVal 906 has reached its maximum value. The amplitude of oscillation continues to increase, and reaches a switchover threshold 916, 918 after about 13 μsec.

The mode of operation changes from single-ended to differential when the switchover threshold 916, 918 is reached, as represented by signal 910. At the switchover, one or more of the control variables gmVal 906, capVal 908 and vddVal (not shown in FIG. 9) may be set to values that are suitable for operating in differential mode. This may be considered as setting one or more of the circuit parameters to a preset value when the circuit changes mode of operation. It can be seen from the example of FIG. 9 that gmVal 906 is automatically reduced and capVal 908 is automatically increased when the circuit switches to differential mode. The new values for the control variables can be fixed preset values, or values retrieved from a memory that are representative of values that were previously used while operating in differential mode. For example, time averaged values for the control variables can be stored in memory. Presetting the values of control signals at changeover to differential mode (as opposed to letting the control loop establish the correct values) can reduce transient effects and speed-up the settling of the oscillator amplitude to values needed for optimal performance after entering the second mode of operation.

FIG. 10 illustrates operation of the circuits of FIGS. 8a and 8b when started in differential mode. The same signals are shown as in FIG. 9. The results of FIG. 10 show the frequency of oscillation of the circuit to be 3.37 MHz, which is the unwanted frequency response shown in FIG. 3.

FIG. 11 illustrates further simulation results. The simulation was performed with the following circuit values: Q=730 (Ls=20.9 u, Cs=400 f, Rs=10).
Shown in FIG. 11 are the following signals:
Reference 1102—the amplitude of the voltage signal at the second terminal 812 of the oscillator circuit 802 (Xtal2);
Reference 1104—the amplitude of the voltage signal at the first terminal 810 of the oscillator circuit 802 (Xtal1);
Reference 1106—the value for the control signal gmVal 850; and
Reference 1018—the output of the differential detector 840 as it relates to an upper target threshold 1110 and a lower target threshold 1112.

The simulation starts with gmVal (1106) set at 64. After 3.2 μsec, the oscillation circuit switches to differential mode and gmVal is forcibly switched to 14.

As discussed above, the control signals (which can include gmVal, capVal and vddVal—not shown in FIG. 11) can be adjusted such that the detector output signal 1018 is adjusted such that it tends towards being between the upper target threshold 1110 and the lower target threshold 1112.

It will be appreciated that the time scales in FIG. 11 are different from the timescales in FIGS. 9 and 10 as the initial conditions are different.

FIGS. 12a and 12b illustrate example implementations of the two types of unit gm cells that can be joined together (n) to forms one of the inverting amplifiers that are used in the oscillator circuit. Both types are used together in each of the 2 cells, connected anti-parallel to create a differential topology. The cell shown in FIG. 12b has a capacitor 1218' connected in series before the output of the cell. This capacitor 1218' can be used instead of the AC coupling capacitors 814, 818 shown in FIG. 8. The cell shown in FIG. 12a may be referred to as a capacitance unit cell. The cell shown in FIG. 12b may be referred to as a DC connected unit cell.

Depending upon required activity, up to 64 cells of the type shown in FIG. 12a are active when the oscillator circuit is operating in differential mode. The DC connected cells then are off. A cell can be de-activated by applying 0V to terminal B 1202' and vdd_1v2 1204' to terminal Bn 1206'. This causes transistors MN10 1210' and MP8 1212' (FIG. 12a) to be turned off. No DC current can flow through transistors MN1 1214' and MP1 1216' (the actual amplifier) and the cell is disabled (without affecting the DC operating point and input and output). Reversing the connections to B=vdd_1v2 (1202' is connected to 1204') and Bn=0V (1206' is connected to 0V) turns the cell on.

At start-up, when in single ended mode, only one of the anti-parallel connected cells is active and then both capacitance and DC connected unit cells are active. When maximum activity is needed, a total of 64 capacitance unit cells (FIGS. 12a) and 64 DC connected unit cells (FIG. 12b) operate in parallel. This implementation hence merges the capacitance switching with gm cell switching, assuming that the capacitance values scale proportionally with the gm requirement.

It will be appreciated that the embodiment shown in FIGS. 12a and 12b represents an alternative to the embodiment shown in FIGS. 8a and 8b where coupling capacitors are separate from the amplifier cells.

In the above embodiments, the amplitude of the oscillation signal is measured to determine when the oscillator circuit should switch to differential mode of operation. Thus, the amplitude of the oscillation signal can be considered as an operational parameter that can be compared with a switchover threshold in order to control the mode of operation of the oscillator circuit. In other embodiments, different operational parameters can be used. For example, the spectral purity of the oscillator signal could be processed, possibly by a DSP that may involve performing a fast Fourier transform (FFT) either in full or at a particular harmonic, or in a digital phase locked loop (PLL) to determine a measure for the phase noise.

One or more embodiments disclosed herein can be used in any CMOS application that uses a reference oscillator working from a crystal or other mechanical high Q factor resonator.

Disclosed herein is a CMOS differential crystal oscillator that uses a pair of digital inverters as a sustaining amplifier to achieve maximal oscillator swing for a given supply voltage. Any need for a secondary oscillation mode associated with the differential topology can be circumvented by starting the oscillator in single-ended mode and switching to differential mode as soon as sufficient oscillation amplitude has developed. The circuit topology and start-up method can make it suitable for a wide range of crystal frequencies and crystal types. The use of a digital inverter can make the oscillator easily scalable to next deep submicron CMOS node and allow operation from a very low supply voltage.

It will be appreciated that any components that are described herein as being coupled or connected could be directly or indirectly coupled or connected. That is, one or more components could be located between two components that are said to be coupled or connected whilst still enabling the required functionality to be achieved.

The invention claimed is:

1. An oscillator circuit comprising:
   first and second resonator terminals for connecting to respective terminals of a resonator;
   a first inverting amplifier connected between the first and second resonator terminals in a first mode of operation;
   a back to back pair of second inverting amplifiers connected between the first and second resonator terminals in a second mode of operation; and
   a controller configured to compare an operational parameter of the oscillator circuit to a switchover threshold, and switch the oscillator circuit from the first mode of operation to the second mode of operation when the operational parameter exceeds the switchover threshold;
   wherein the operational parameter is the amplitude at a resonator terminal of the oscillator circuit; and
   wherein the controller comprises a detector configured to measure the operational parameter of the oscillator circuit; and
   wherein the controller further comprises a comparator configured to compare the measured operational parameter of the oscillator circuit with at least one target threshold in the second mode of operation; and
   the at least one target threshold comprises an upper target threshold and a lower target threshold; wherein the controller is configured to set at least one circuit parameter to cause the operational parameter to be between the upper and lower target thresholds; and
   the oscillator circuit is configured to set at least one of the circuit parameters to at least one preset value when switching the oscillator circuit from the first mode of operation to the second mode of operation; and
   the at least one preset value corresponds to those established during a previous operation of the oscillator circuit in the second mode of operation.

2. The oscillator circuit of claim 1, wherein the at least one circuit parameter comprises at least one of the gain of the second inverting amplifiers and a supply voltage to the second inverting amplifiers.

3. The oscillator circuit of claim 1, further comprising a variable coupling capacitor in series with each member of the back to back pair of second inverting amplifiers between the first and second resonator terminals, and the at least one circuit parameter comprise the capacitance of the coupling capacitors.

4. The oscillator circuit of claim 1, wherein one of the back to back pair of inverting second amplifiers is the first inverting amplifier.

5. The oscillator circuit of claim 4, wherein the controller is configured to disconnect one of the back to back pair of inverting second amplifiers from between the first and second resonator terminals when the oscillator circuit is in the first mode of operation.

6. The oscillator circuit of claim 4, wherein the controller is configured to include a coupling capacitor in series with the first inverting amplifier in the second mode of operation, and exclude the coupling capacitor in the first mode of operation.

7. The oscillator circuit of claim 1, wherein the resonator is a crystal resonator.

8. An integrated circuit comprising the oscillator circuit of claim 1.

* * * * *